(12) United States Patent
Tsuruoka et al.

(10) Patent No.: US 9,985,228 B2
(45) Date of Patent: May 29, 2018

(54) DISPLAY DEVICE AND METHOD FOR MANUFACTURING THE SAME

(71) Applicant: Japan Display Inc., Minato-ku (JP)

(72) Inventors: Kazuto Tsuruoka, Minato-ku (JP);
Naohisa Andou, Minato-ku (JP);
Takashi Saeki, Minato-ku (JP);
Megumi Senda, Minato-ku (JP);
Yusuke Goto, Minato-ku (JP)

(73) Assignee: Japan Display Inc., Minato-ku (JP)

( * ) Notice: Subject to any disclaimer, the term of this patent is extended or adjusted under 35 U.S.C. 154(b) by 0 days. days.

(21) Appl. No.: 15/421,820

(22) Filed: Feb. 1, 2017

(65) Prior Publication Data

US 2017/0229666 A1    Aug. 10, 2017

(30) Foreign Application Priority Data

Feb. 10, 2016 (JP) ................. 2016-023865

(51) Int. Cl.
*H01L 33/00*     (2010.01)
*H01L 51/00*     (2006.01)
*H01L 51/52*     (2006.01)

(52) U.S. Cl.
CPC ...... *H01L 51/0097* (2013.01); *H01L 51/5237* (2013.01); *H01L 2251/5338* (2013.01); *Y02E 10/549* (2013.01)

(58) Field of Classification Search
CPC ................. H01L 51/0097; H01L 2251/5338
USPC ........................................................ 257/88
See application file for complete search history.

(56) References Cited

U.S. PATENT DOCUMENTS

2016/0035812 A1    2/2016  Kwon et al.
2016/0093685 A1*   3/2016  Kwon ................. H01L 27/3276
                                            257/40

FOREIGN PATENT DOCUMENTS

JP    2007-27222       2/2007
JP    2010-98645       4/2010
KR    10-2015-0014713  2/2015

OTHER PUBLICATIONS

Office Action dated Sep. 20, 2017 in Korean Patent Application No. 10-2017-0016891 (with English translation).

* cited by examiner

*Primary Examiner* — Thien F Tran
(74) *Attorney, Agent, or Firm* — Oblon, McClelland, Maier & Neustadt, L.L.P.

(57) ABSTRACT

A flexible display is bent in an intermediate region such that a first region and a second region overlap each other. A spacer is disposed inside a bend of the flexible display. The spacer includes a front-side region overlapping the first region, a back-side region overlapping the second region, and a guide region overlapping the intermediate region and regulating the bend. The spacer includes, in the front-side region, a first step and a first bottom surface recessed below the guide region. The spacer includes, in the back-side region, a second step and a second bottom surface recessed below the guide region. An interval between a second reinforcing film and a second raised surface located at the second step is larger than an interval between a first reinforcing film and a first raised surface located at the first step.

5 Claims, 6 Drawing Sheets

DISPLAY DEVICE AND METHOD FOR MANUFACTURING THE SAME

CROSS-REFERENCE TO RELATED APPLICATION

The present application claims priority from Japanese application JP2016-023865 filed on Feb. 10, 2016, the content of which is hereby incorporated by reference into this application.

BACKGROUND OF THE INVENTION

1. Field of the Invention

The present invention relates to a display device and a method for manufacturing the same.

2. Description of the Related Art

In recent years, narrowing a so-called picture-frame region (narrower picture-frame) that is located at the peripheral edge of a display region where an image is displayed has been required in order to miniaturize a display device or to widen the display region. Wiring lines or circuits are provided in the picture-frame region. The requirement for the narrower picture-frame is demanding especially in a mobile device such as a smartphone. However, there is an impression that the ideas for the narrower picture-frame have already run out, and thus the narrower picture-frame has to be dealt with by other methods.

Therefore, it has been studied to substantially achieve the narrower picture-frame by using a flexible display and folding the picture-frame region of the flexible display onto the back side. JP 2010-098645 A discloses a flexible display is which a circuit layer and an organic electroluminescent layer are formed on a resin substrate having flexibility.

When the picture-frame region of the flexible display is folded to be excessively small, the disconnection or breakage of the wiring line or circuit occurs. It is necessary to regulate the folding within the allowable range. JP 2007-027222 A discloses a flexible printed board whose reliability is improved by preventing the disconnection at a bent portion using regulating films. However, since the regulating range of the folding varies due to the positional shift of the regulating film, a further improvement is required. Moreover, a reinforcing film may be attached to the rear surface of the flexible display, and this forms a convex portion on the rear surface. Therefore, it is necessary to fix the flexible display so as not to interfere with the convex portion.

SUMMARY OF THE INVENTION

It is an object of the invention to fix a flexible display so as not to interfere with other components.

A display device according to an aspect of the invention includes: a flexible display including a first region and a second region, the flexible display including an intermediate region in the second region, the flexible display being bent in the intermediate region such that the first region and the second region overlap each other, the flexible display being provided with a light-emitting element layer in the first region; a spacer disposed inside a bend of the flexible display, the spacer including a front-side region overlapping the first region, a back-side region overlapping the second region, and a guide region overlapping the intermediate region and regulating the bend, the spacer including, in the front-side region, a first step and a first bottom surface recessed below the guide region, the spacer including, in the back-side region, a second step and a second bottom surface recessed below the guide region; a first reinforcing film disposed on the first bottom surface so as not to go over the first step and attached to the flexible display; a first adhesive attaching the first reinforcing film to the spacer; a second reinforcing film disposed on the second bottom surface so as not to go over the second step and attached to the flexible display; and a second adhesive attaching the second reinforcing film to the spacer, wherein an interval between the second reinforcing film and a second raised surface located at the second step is larger than an interval between the first reinforcing film and a first raised surface located at the first step. According to the aspect of the invention, since the first step and the second step axe formed on the spacer, the flexible display can be fixed such that the first reinforcing film and the second reinforcing film do not interfere with the spacer.

A method for manufacturing a display device according to an aspect of the invention includes the steps of: preparing a flexible display, the flexible display including a first region and a second region, the flexible display including an intermediate region in the second region, the flexible display being provided with a light-emitting element layer in the first region, the flexible display including, on the side opposite to the light-emitting element layer, a first reinforcing film attached to the first region and a second reinforcing film attached to the second region; preparing a spacer, the spacer including a guide region at an edge portion, the spacer including a front-side region and a back-side region on opposite sides, the spacer including, in the front-side region, a first step and a first bottom surface recessed below the guide region, the spacer including, in the back-side region, a second step and a second bottom surface recessed below the guide region; aligning a leading edge of the first reinforcing film with a first raised surface at the first step and attaching the flexible display to the first bottom surface with a first adhesive; bending the flexible display attached to the first adhesive in the intermediate region while regulating a bend with the guide region of the spacer; and attaching the second reinforcing film attached to the flexible display bent to the second bottom surface with a second adhesive. According to the aspect or the invention, since the first step and the second step are formed on the spacer, the flexible display can be fixed such that the first reinforcing film and the second reinforcing film do not interfere with the spacer.

DETAILED DESCRIPTION OF THE INVENTION

Figure 1:
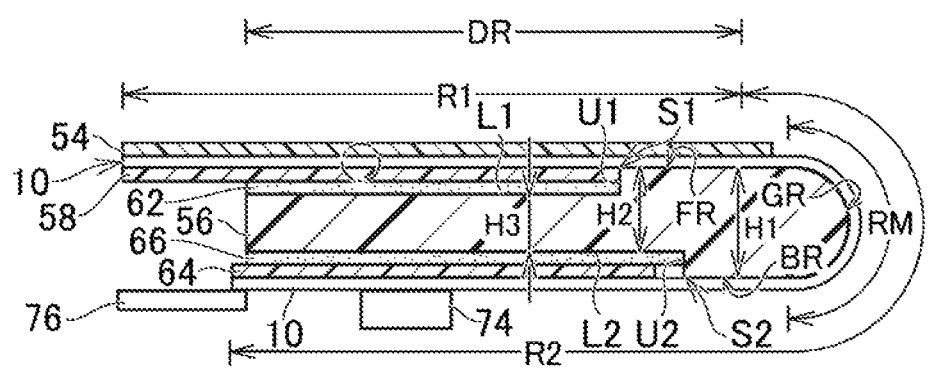
FIG. 1 is a cross-sectional view showing the whole of a display device according to an embodiment of the invention.

Hereinafter, embodiments of the invention will be described with reference to the drawings. However, the invention can be implemented in various aspects within the scope not departing from the spirit of the invention, and should not be interpreted as being limited to the details described in the embodiments illustrated below.

For more clarity of description, the width, thickness, shape, and the like of each part may be schematically represented in the drawings, as compared with those in practicing aspects of the invention. However, they are illustrative only and do not limit the interpretation of the invention. In the specification and the drawings, elements having functions similar to those described in relation to a previous drawing are denoted by the same reference numerals and signs, and a repetitive description may be omitted.

Further, in the detailed description of the invention, the terms "on" and "below" as used in defining the positional relationship between one component and another component include, not only the case where one component is located directly on or directly below another component, but also the case where still another component intervenes between the components unless otherwise noted.

Figure 2:
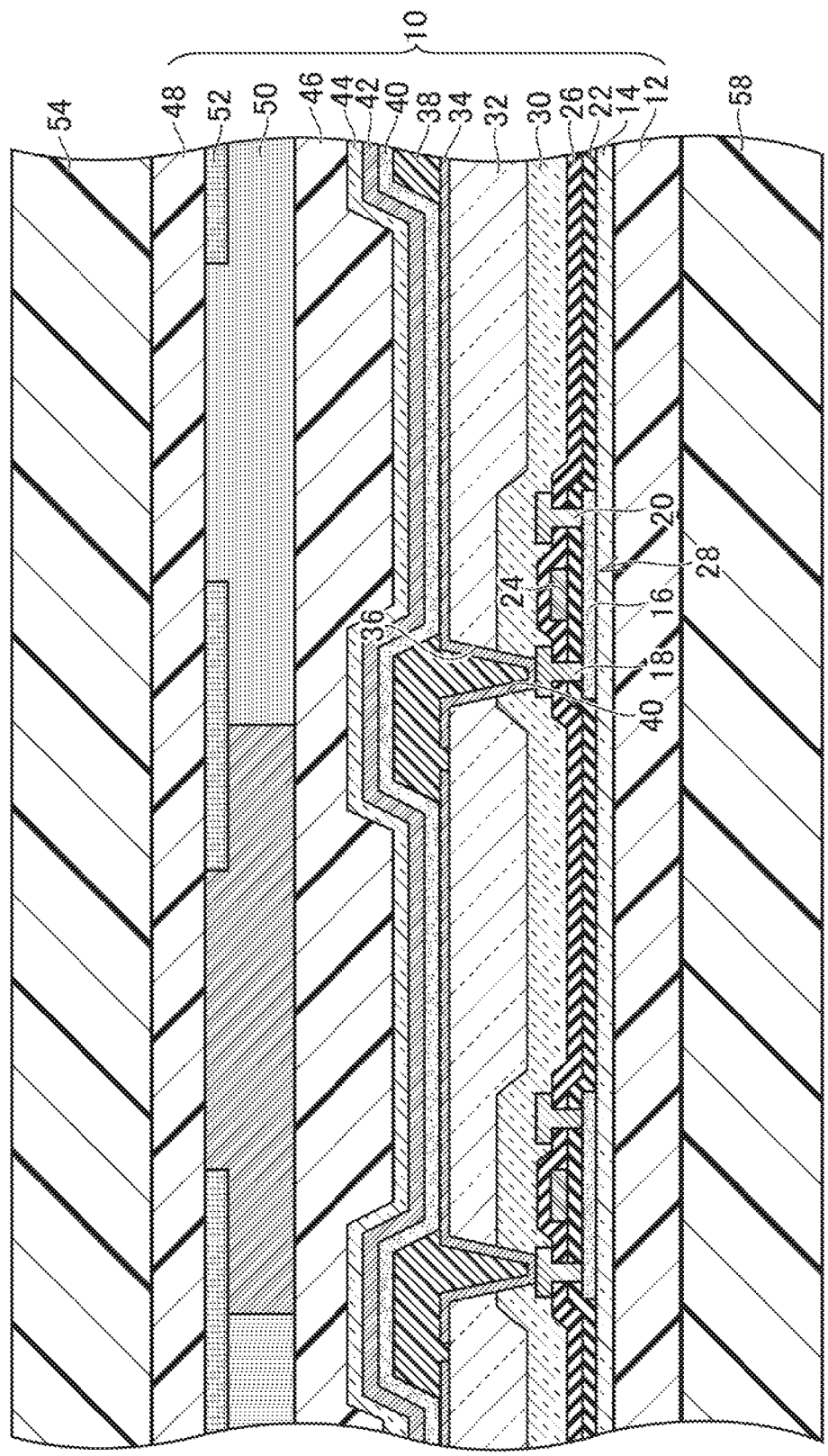
FIG. 2 is an enlarged view of the portion surrounded by the dash-dotted line in FIG. 1.

FIG. 1 is a cross-sectional view showing the whole of a display device according to an embodiment of the invention. FIG. 2 is an enlarged view of the portion surrounded by the dash-dotted line in FIG. 1. As the display device, an organic electroluminescent display device is exemplified. The display device is configured such that, for example, unit pixels (sub-pixels) of multiple colors of red, green, and blue are combined to form a full-color pixel (pixel), thereby displaying a full-color image. The display device includes a flexible display 10.

As shown in FIG. 2, the flexible display 10 includes a first substrate 12 made of resin. An undercoat 14 serving as a barrier to an impurity contained in the first substrate 12 itself is formed on the first substrate 12, and a semiconductor layer 16 is formed on the undercoat 14. A source electrode 18 and a drain electrode 20 are electrically connected to the semiconductor layer 16, and a gate insulating film 22 is formed to cover the semiconductor layer 16. A gate electrode 24 is formed on the gate insulating film 22, and an inter-layer insulating film 26 is formed to cover the gate electrode 24. The source electrode 18 and the drain electrode 20 penetrate the gate insulating film 22 and the inter-layer insulating film 26. The semiconductor layer 16, the source electrode 18, the drain electrode 20, and the gate electrode 24 constitute a thin film transistor 28. A passivation film 30 is provided so as to cover the thin film transistor 28.

A planarization layer 32 is provided on the passivation film 30. A plurality of pixel electrodes 34 (e.g., anodes) configured so as to correspond to a plurality of unit pixels are provided on the planarization layer 32. The planarization layer 32 is formed such that at least the surface on which the pixel electrode 34 is provided is flat. The pixel electrode 34 is electrically connected to one of the source electrode 18 and the drain electrode 20 on the semiconductor layer 16 through a contact hole 36 penetrating the planarization layer 32 and the passivation film 30.

An insulating layer 38 is formed on the planarization layer 32 and the pixel electrode 34. The insulating layer 38 is formed so as to lie on the peripheral edge of the pixel electrode 34 and open a portion (e.g., a central portion) of the pixel electrode 34. The insulating layer 38 forms a bank surrounding a portion of the pixel electrode 34.

A light-emitting element layer 40 is provided on the pixel electrodes 34. The light-emitting element layer 40 continuously lies on the plurality of pixel electrodes 34 and also lies on the insulating layer 38. As a modified example, the light-emitting element layer 40 may be provided individually (separately) for each of the pixel electrodes 34. In this case, the light-emitting element layers 40 emit blue, red, and green lights corresponding to the respective pixels. Therefore, there is no need to provide a color filter to be described later. The light-emitting element layer 40 includes at least a light-emitting layer, and may further include at least one layer of an electron transport layer, a hole transport layer, an electron injection layer, and a hole injection layer.

A common electrode 42 (e.g., a cathode) is provided on the light-emitting element layer 40 so as to be in contact with the light-emitting element layer 40 above the plurality of pixel electrodes 34. The common electrode 42 is formed so as to lie above the insulating layer 38 serving as a bank. The light-emitting element layer 40 is interposed between the pixel electrode 34 and the common electrode 42, and emits light with a luminance controlled by an electric current flowing therebetween.

The light-emitting element layer 40 is covered and thus sealed by a sealing layer 44 stacked on the common electrode 42, so that the light-emitting element layer 40 is shielded from moisture. A second substrate 48 is provided above the sealing layer 44 with a filling layer 46 therebetween. Colored layers 50 of multiple colors (e.g., blue, red, and green) are provided on the second substrate 48, and a black matrix 52 is formed of metal or resin between the colored layers 50 of different colors adjacent to each other, so that the color filter is configured. The second substrate 48 may be a touch panel, and may include a polarizer or a retardation film.

As shown in FIG. 1, the flexible display 10 includes a first region R1. The first region R1 includes an image display region DR. The light-emitting element layer 40 is provided in the first region R1 (specifically the image display region DR being a portion of the first region R1). A front reinforcing film 54 is attached to the first region R1 of the flexible display 10. The front reinforcing film 54 is provided so as to cover the light-emitting element layer 40. The flexible display 10 includes a second region R2. The second region R2 is a peripheral region adjacent to one side of the image display region DR. The flexible display 10 includes an intermediate region RM in the second region R2. The flexible display 10 is bent in the intermediate region RM, so that the first region R1 and the second region R2 overlap each other.

A spacer 56 is disposed inside the bend of the flexible display 10. The spacer 56 includes a guide region GR that overlaps the intermediate region RM of the flexible display 10 and regulates the bend. The guide region GR is a curved surface corresponding to the radius of bend of the flexible display 10 to be bent.

The spacer 56 includes a front-side region FR that overlaps the first region R1 of the flexible display 10. A first bottom surface L1 formed by being recessed below the surface of the guide region GR due to a first step S1 is located in the front-side region FR. The first bottom surface L1 is a flat surface. The front-side region FR is a flat surface also between the first step S1 and the guide region GR (see FIG. 4). The front reinforcing film 54 overlaps a region from the first bottom surface L1 over the first step S1.

A first reinforcing film 58 is attached to the flexible display 10. The first reinforcing film 58 is located on the side opposite to the front reinforcing film 54. The first reinforcing film 58 is disposed on the first bottom surface L1 so as not to go over the first step S1. The first reinforcing film 58 is in contact with a first raised surface U1 located at the first step S1. The first reinforcing film 58 is attached to the spacer 56 with a first adhesive 62, and the first adhesive 62 is provided so as to reach the first raised surface U1 located at the first step S1.

The spacer 56 includes a back-side region BR that overlaps the second region R2 (excluding the intermediate region RM) of the flexible display 10. A second bottom surface L2 recessed below the surface of the guide region GR due to a second step S2 is located in the back-side region BR. The second bottom surface L2 is a flat surface. The back-side region BR is a flat surface also between the second step S2 and the guide region GR. The second step S2 is located at a position closer to the guide region GR than the first step S1, and is shifted in the right direction in FIG. 1. In the area outside the intermediate region RM, the relation: H1>H2>H3 is established where H1 is the thickness of a portion that avoids both of the first bottom surface L1 and the second bottom surface L2, H2 is the thickness of a portion that overlaps the second bottom surface L2 but avoids the first bottom surface L1, and H3 is the thickness of a portion that overlaps the first bottom surface L1 and the second bottom surface L2.

A second reinforcing film 64 is attached to the flexible display 10. The second reinforcing film 64 is disposed on the second bottom surface L2 so as not to go over the second step S2. The second reinforcing film 64 is attached to the spacer 56 with a second adhesive 66, and the second adhesive 66 is provided so as to reach a second raised surface U2 located at the second step S2. A gap is present between the edge of the second reinforcing film 64 and the second step S2 (the second raised surface U2). The interval (e.g., 0.01 mm to 0.8 mm) between the second reinforcing film 64 and the second raised surface U2 located at the second step S2 is larger than the interval (e.g., 0 mm) between the first reinforcing film 58 and the first raised surface U1 located at the first step S1.

According to the embodiment, since the first step S1 and the second step S2 are formed on the spacer 56, the flexible display 10 can be fixed such that the first reinforcing film 58 and the second reinforcing film 64 do not interfere with the spacer 6.

Figure 3:
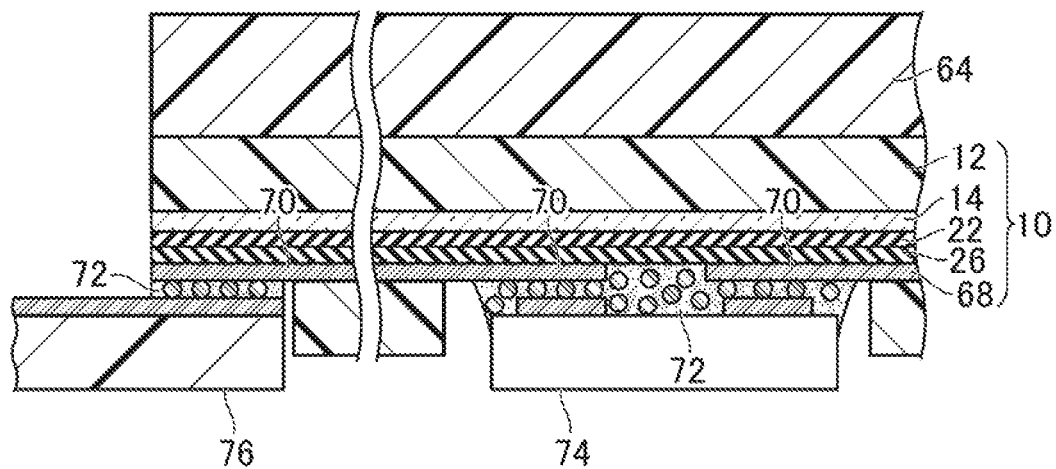
FIG. 3 is an enlarged cross-sectional view of the edge portion of a second region of a flexible display.

FIG. 3 is an enlarged cross-sectional view of the edge portion of the second region R2 of the flexible display 10. A wiring line 68 is provided in the second region R2. The wiring line 68 passes from the first region R1 through the intermediate region RM to reach the second region R2. The wiring line 68 is formed in the same layer as, for example, the source electrode 18 and the drain electrode 20. The wiring line 68 includes a terminal 70. The terminal 70 is electrically connected to an integrated circuit chip 74 and a flexible board 76 through an anisotropic conductive film 72.

Figure 4:
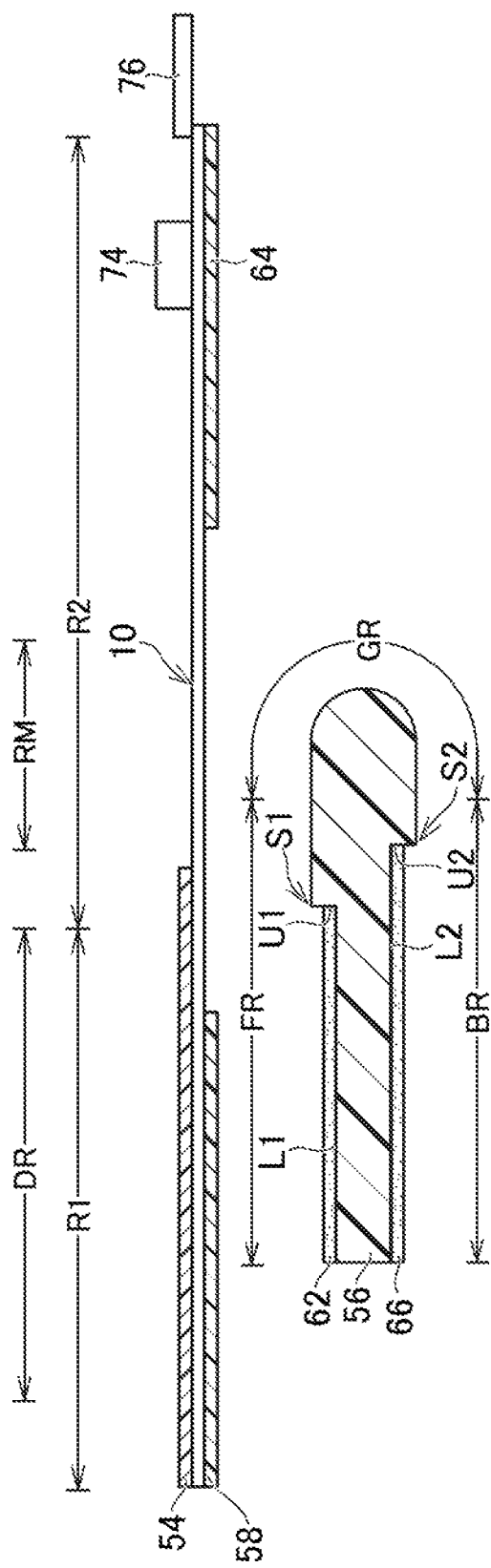
FIG. 4 is a diagram for explaining a method for manufacturing a display device according to an embodiment of the invention.
Figure 5:
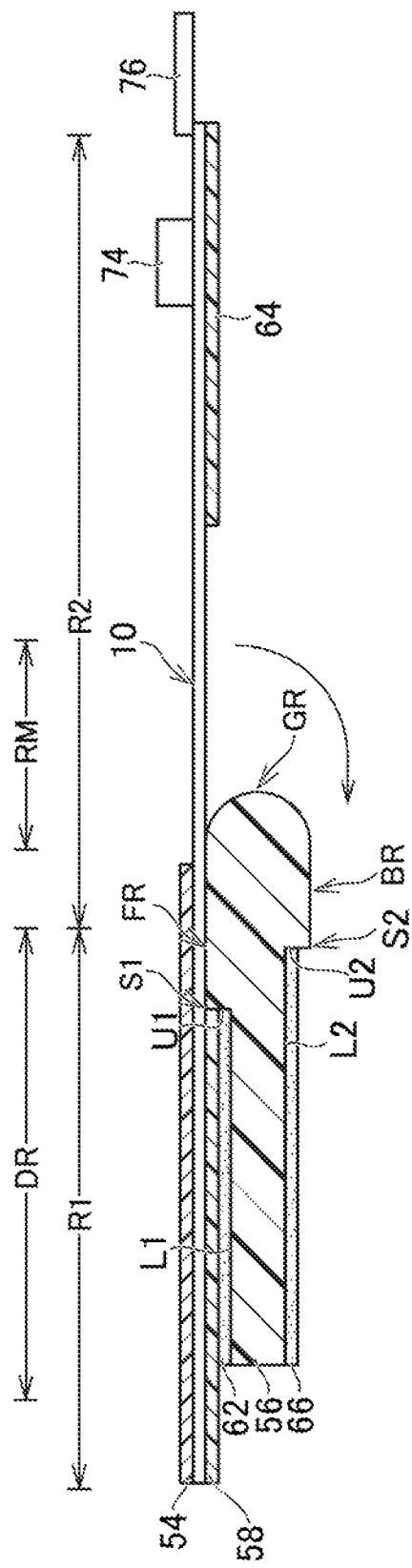
FIG. 5 is a diagram for explaining the method for manufacturing a display device according to the embodiment of the invention.

FIGS. 4 and 5 are diagrams for explaining a method for manufacturing a display device according to an embodiment of the invention. In the embodiment, the flexible display 10 is prepared. The flexible display 10 includes the first region R1 and the second region R2. The light-emitting element layer 40 is provided in the first region R1. A region where the light-emitting element layer 40 is provided is the image display region DR. The first reinforcing film 58 is attached to the first region R1 on the side opposite to the light-emitting element layer 40. The second reinforcing film 64 is attached to the second region R2.

The front reinforcing film 54 is attached on the light-emitting element layer 40 provided in the first region R1. The front reinforcing film 54 is longer in the direction of the intermediate region RM of the flexible display 10 than the first reinforcing film 58. That is, the leading edge of the front reinforcing film 54 and the leading edge of the first reinforcing film 58 are shifted from each other. With this configuration, when the flexible display 10 is bent, stress is not concentrated on a portion of the flexible display 10 that is adjacent to the leading edge of the first reinforcing film 58.

Moreover, the spacer 56 is prepared. The spacer 56 includes the guide region GR at the edge portion, and includes the front-side region FR and the back-side region BR on opposite sides. In the front-side region FR, the first step S1 is located, and the first bottom surface L1 recessed below the surface of the guide region GR is located. In the back-side region BR, the second step S2 is located, and second bottom surface L2 recessed below the surface of the guide region GR is located. The second step S2 is located at the position closer to the guide region GR than the first step S1.

When the position where the flexible display 10 is to be bent and the positions where the first reinforcing film 58 and the second reinforcing film 64 are to be attached are previously determined, the spacer 56 is designed as follows. First, the shape of the curved surface of guide region GR is determined. Specifically, the surface shape of the guide region GR is determined so as to be a curved surface corresponding to the radius of the bending inner surface of the flexible display 10 to be bent.

Next, a length from the boundary between the front-side region FR and the guide region GR to the first step S1 is determined such that a bendable region (a region including assembly errors) of the flexible display 10 that includes the intermediate region RM (a region to be actually bent) corresponds to the guide region GR of the spacer 56. Specifically, the bendable region of the flexible display 10 is designed so as to overlap the boundary between the front-side region FR and the guide region GR and overlap the boundary between the back-side region BR and the guide region GR.

Next, a length from the boundary between the back-side region BR and the guide region GR to the second step S2 is determined. Specifically, the length is designed such that when the flexible display 10 is bent, the second reinforcing film 64 attached to the flexible display 10 faces the second bottom surface L2 without overlapping the second step S2. At this time, the position of the second step S2 is brought closer to the direction of the guide region GR than the position corresponding to the edge of the second reinforcing film 64 in consideration of assembly errors.

The first adhesive 62 such as a double-faced tape is provided on the first bottom surface L1. The first adhesive 62 is provided so as to reach the first raised surface U1 at the first step S1. The second adhesive 66 such as a double-faced tape is provided on the second bottom surface L2. The second adhesive 66 is provided so as to reach the second raised surface U2 at the second step S2.

As shown in FIG. 5, for attaching the flexible display 10 to the spacer 56, the leading edge of the first reinforcing film 58 is first aligned with the first raised surface U1 at the first step S1. Specifically, the first reinforcing film 58 is caused to abut against the first raised surface U1 at the first step S1. Then, the flexible display 10 is attached to the first bottom surface L1 with the first adhesive 62.

Next, the flexible display 10 attached to the first adhesive 62 is bent in the intermediate region RM while the bend is regulated by the guide region GR of the spacer 56. Since an adhesive is not provided on the guide region GR, bending is easily performed.

Then, the second reinforcing film 64 attached to the flexible display 10 bent is attached to the second bottom surface L2 with the second adhesive 66 (see FIG. 1).

According to the embodiment, since the first step S1 and the second step S2 are formed on the spacer 56, the flexible display 10 can be fixed such that the first reinforcing film 58 and the second reinforcing film 64 do not interfere with the spacer 56. Moreover, the position of the second reinforcing film 64 is set such that the second step S2 is located at the position (shifted in the right direction in FIG. 5) closer to the guide region GR than the first step S1 and that a gap is provided between the second raised surface U2 and the second reinforcing film 64 as shown in FIG. 1. By doing this, the second reinforcing film 64 does not go over and override on the second step S2 even if the attachment position is slightly shifted.

Figure 6:
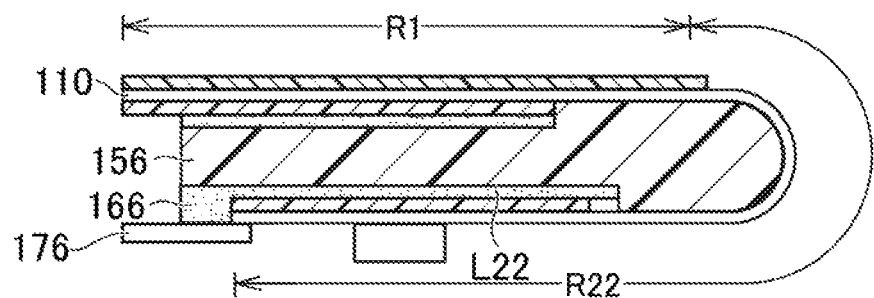
FIG. 6 is a cross-sectional view showing a modified example of the display device according to the embodiment of the invention.

FIG. 6 is a cross-sectional view showing a modified example of the display device according to the embodiment of the invention. In this example, a wiring board 176 such as a flexible board is mounted to the leading edge portion of a second region R22 of a flexible display 110, and projects from the flexible display 110. A spacer 156 has a shape in which a second bottom surface L22 projects from the flexible display 110. A second adhesive 166 is provided so as to attach the wiring board 176 and the second bottom surface L22 to each other.

In the step of preparing the flexible display 110, the wiring board 176 is mounted to the leading edge portion of the second region R22 so as to project from the flexible display 110. Then, in the step of attaching the flexible display 110 to the second adhesive 166, the wiring board 176 is attached to the second bottom surface L22 with the second adhesive 166. According to this configuration, since at least a portion of the wiring board 176 that is close to the flexible display 110 is fixed to the spacer 156, the connection between the wiring board 176 and the flexible display 110 can be reinforced.

The display device is not limited to the organic electroluminescent display device. The display device may be a display device including a light-emitting element such as a quantum-dot light-emitting element (quantum-dot light-emitting diode (QLED)) in each pixel, or a liquid crystal display device.

While there have been described what are at present considered to be certain embodiments of the invention, it will be understood that various modifications may be made thereto, and it is intended that the appended claims cover all such modifications as fail within the true spirit and scope of the invention.

What is claimed is:

1. A display device comprising:
   a flexible display including a first region and a second region, the flexible display including an intermediate region in the second region, the flexible display being bent in the intermediate region such that the first region and the second region overlap each other, the flexible display being provided with a light-emitting element layer in the first region;
   a spacer disposed inside a bend of the flexible display, the spacer including a front-side region overlapping the first region, a back-side region overlapping the second region, and a guide region overlapping the intermediate region and regulating the bend, the spacer including, in the front-side region, a first step and a first bottom surface recessed below the guide region, the spacer including, in the back-side region, a second step and a second bottom surface recessed below the guide region;
   a first reinforcing film disposed on the first bottom surface so as not to go over the first step and attached to the flexible display;
   a first adhesive attaching the first reinforcing film to the spacer;
   a second reinforcing film disposed on the second bottom surface so as not to go over the second step and attached to the flexible display; and
   a second adhesive attaching the second reinforcing film to the spacer, wherein
   an interval between the second reinforcing film and a second raised surface located at the second step is larger than an interval between the first reinforcing film and a first raised surface located at the first step, and
   the first reinforcing film is in contact with the first raised surface located at the first step.

2. The display device according to claim 1, wherein the second step is located at a position closer to the guide region than the first step.

3. The display device according to claim 1, further comprising, in the first region of the flexible display, a front reinforcing film attached so as to overlap a region from the first bottom surface over the first step on the side opposite to the first reinforcing film.

4. The display device according to claim 1, wherein
   the first adhesive is provided so as to reach the first raised surface located at the first step, and
   the second adhesive is provided so as to reach the second raised surface located at the second step.

5. The display device according to claim 1, further comprising a wiring board mounted to a leading edge portion of the second region and projecting from the flexible display, wherein
   the spacer has a shape in which the second bottom surface projects from the flexible display, and
   the second adhesive is provided so as to attach the wiring board and the second bottom surface to each other.

* * * * *